United States Patent
Park

(10) Patent No.: US 8,673,734 B2
(45) Date of Patent: Mar. 18, 2014

(54) SEMICONDUCTOR DEVICE AND METHOD FOR FABRICATING THE SAME

(75) Inventor: Soonyeol Park, Seoul (KR)

(73) Assignee: Dongbu Hitek Co., Ltd, Seoul (KR)

( * ) Notice: Subject to any disclaimer, the term of this patent is extended or adjusted under 35 U.S.C. 154(b) by 0 days.

(21) Appl. No.: 13/424,148

(22) Filed: Mar. 19, 2012

(65) Prior Publication Data

US 2013/0154014 A1 Jun. 20, 2013

(51) Int. Cl.
*H01L 21/76* (2006.01)

(52) U.S. Cl.
USPC .................... 438/424; 438/425; 257/E21.545

(58) Field of Classification Search
USPC .............. 438/425, 426; 257/E21.54, E21.545
See application file for complete search history.

(56) References Cited

U.S. PATENT DOCUMENTS

| | | | |
|---|---|---|---|
| 6,376,296 B2* | 4/2002 | Tung ............................ | 438/221 |
| 2002/0110968 A1 | 8/2002 | Kim | |
| 2006/0006462 A1* | 1/2006 | Chang et al. .................. | 257/341 |
| 2007/0267693 A1* | 11/2007 | Chien et al. ................... | 257/343 |
| 2009/0072308 A1* | 3/2009 | Chen et al. .................... | 257/336 |
| 2010/0270614 A1* | 10/2010 | Croce et al. ................... | 257/337 |

FOREIGN PATENT DOCUMENTS

| | | |
|---|---|---|
| JP | 1-215036 A | 8/1989 |
| KR | 2002-0066629 | 8/2002 |
| KR | 10-0557977 B1 | 2/2006 |

OTHER PUBLICATIONS

Yoon, Hong Sik; Method for Manufacturing Dual Gate Oxidation Layer of Semiconductor Device; Korean Patent Abstracts, Publication No. 1020000067445 A; Nov. 15, 2000; Korean Intellectual Property Office, http://kpa.kipris.or.kr/.

Ichikawa, Matsuo; Semiconductor Integrated Circuit Device; Abstract of JPH01215036 (A); Aug. 29, 1989; European Patent Office, http://worldwide.espacenet.com/.

* cited by examiner

*Primary Examiner* — Daniel Whalen
*Assistant Examiner* — Shaka White
(74) *Attorney, Agent, or Firm* — Murabito, Hao & Barnes LLP; Andrew D. Fortney

(57) ABSTRACT

A semiconductor device and a method for fabricating the same are disclosed. The method for fabricating the semiconductor device includes forming an shallow trench isolation (STI) in a substrate, sequentially forming an oxide layer and a nitride layer over the substrate, patterning the nitride layer and the oxide layer to expose a portion of the substrate adjacent to the STI layer, forming a field oxide layer contacting the STI layer in the exposed portion of the substrate, removing the nitride layer, etching a portion of the patterned oxide layer to form a first gate oxide layer contacting the field oxide layer, forming a second gate oxide layer over the substrate, and forming a gate pattern over the field oxide layer, the first gate oxide layer, and the second gate oxide layer.

20 Claims, 4 Drawing Sheets

SEMICONDUCTOR DEVICE AND METHOD FOR FABRICATING THE SAME

RELATED APPLICATIONS

This application claims the benefit of Korean Patent Application No. 10-2011-0145933, filed on Dec. 29, 2011, which is hereby incorporated by reference as if fully set forth herein.

FIELD OF THE INVENTION

The present invention relates to a semiconductor device, and methods of fabricating the same. More particularly, the present invention relates to a semiconductor device with an improved HCI (Hot Carrier Injection) characteristic due to a reduced current path around a shallow trench isolation (STI) layer, and a method for fabricating the same.

BACKGROUND OF THE INVENTION

Semiconductor fabrication technology generally requires high integration and high performance. Manufacturing techniques for reducing MOSFET gate line widths and device isolation structures are most closely related to the high integration of a semiconductor device. To improve device integration, much effort has been devoted toward improving isolation techniques.

Conventional techniques for forming device isolation structures include the recessed-local oxidation of silicon (R-LOCOS) method and the shallow trench isolation (STI) method. In particular, high voltage semiconductor devices generally have a field oxide layer or STI layer in order to increase breakdown voltages.

The STI process is generally more efficient than the process of forming a field oxide layer (e.g., using the R-LOCOS method). Consequently, the STI method tends to be more widely used.

The presence of an STI layer in a channel helps to improve breakdown voltage characteristics, but causes an excessive electric field to be formed near an edge of the STI layer upon the movement of electrons in the channel. This leads to the generation of a large amount of hot carriers, resulting in undesirable hot carrier injection (HCI) characteristics. The HCI characteristics are a very important index that is generally used to judge the reliability of a semiconductor device. Therefore, it is important to improve the HCI characteristics in the development of devices.

FIG. 1 shows a typical current flow observed around a STI layer in a semiconductor device. As can be seen from FIG. 1, the current is concentrated near the bottom edge of the STI layer adjacent to a channel formed in a semiconductor substrate.

SUMMARY OF THE INVENTION

The present invention provides a semiconductor device and a method for fabricating the same. The semiconductor device may have improved HCI characteristics due to the presence of (i) a field oxide layer adjacent to an STI layer, and (ii) two gate oxide layers to ensure the mitigation of a current path and electric field distribution.

Objects and benefits of the present invention are not limited to those described herein. It will be understood by those skilled in the art that other objects, embodiments, and benefits not explicitly described herein are within the scope of the invention.

In one aspect, the present invention relates to a method for fabricating a semiconductor device, the method comprising:
- forming a shallow trench isolation (STI) layer in a portion of a semiconductor substrate;
- sequentially forming an oxide layer and a nitride layer on the semiconductor substrate in which the STI layer is formed;
- patterning the nitride layer and the oxide layer to expose a portion of the semiconductor substrate adjacent to the STI layer and define a field oxide region;
- forming a field oxide layer in contact with the STI layer over the exposed portion of the semiconductor substrate;
- removing the nitride layer;
- forming a first gate oxide layer contacting the field oxide layer by etching a portion of the patterned oxide layer;
- forming a second gate oxide layer on the semiconductor substrate; and
- forming a gate pattern over the field oxide layer, the first gate oxide layer, and the second gate oxide layer.

Preferably, the first gate oxide layer is thicker than the second gate oxide layer.

Preferably, the first gate oxide layer has a portion that is in contact with an edge portion of the field oxide.

Preferably, forming the first gate oxide layer comprises:
- forming a photoresist pattern covering a portion of the oxide layer that is in contact with the field oxide layer;
- forming the first gate oxide layer by removing a portion of the oxide layer exposed by the photoresist pattern; and
- removing the photoresist pattern.

Preferably, the field oxide layer has a lower portion that is in contact with the STI layer (e.g., an upper edge of the STI layer).

In accordance with another aspect, the present invention relates to a semiconductor device, comprising:
- a shallow trench isolation (STI) layer (e.g., formed by depositing an oxide layer in a trench) in a semiconductor substrate;
- a field oxide layer in a portion of the semiconductor substrate adjacent to the STI layer;
- a first gate oxide layer on the semiconductor substrate adjacent to the field oxide layer;
- a second gate oxide layer on an upper portion of the semiconductor substrate at sides of the first gate oxide layer (e.g., surrounding the first gate oxide layer); and
- a gate pattern over (e.g., covering) the field oxide layer, the first gate oxide layer, and the second gate oxide layer.

Preferably, the first gate oxide layer is thicker than the second gate oxide layer.

Preferably, the first gate oxide layer is in contact with an edge portion of the field oxide layer.

Preferably, a portion (e.g., a lower or edge portion) of the field oxide layer is in contact with an upper edge of the STI layer.

BRIEF DESCRIPTION OF THE DRAWINGS

The objects, benefits, and features of the present invention discussed above will be further explained in the following description of various embodiments. The accompanying drawings illustrate embodiments of the invention and, along with the description, serve to explain the principles of the invention. In the drawings.

DETAILED DESCRIPTION OF THE EMBODIMENTS

The advantages and features of the present invention and methods of accomplishing these advantages and features will be clearly understood from the following description of various embodiments taken in conjunction with the accompanying drawings. However, the present invention is not limited to the following description and is intended to cover alternatives, modifications, and equivalents that may be included within the spirit and scope of the invention as defined in the appended claims. It should be noted that the present description of the embodiments is provided to describe and explain, but not limit the invention.

A semiconductor device having improved HCI characteristics that mitigate a current path and an electric field distribution, and a method for fabricating the same, will be described in detail with reference to the accompanying drawings.

FIGS. 2A to 2G are cross-sectional views illustrating a sequential fabrication method for a semiconductor device in accordance with an embodiment of the present invention.

Figure 1:
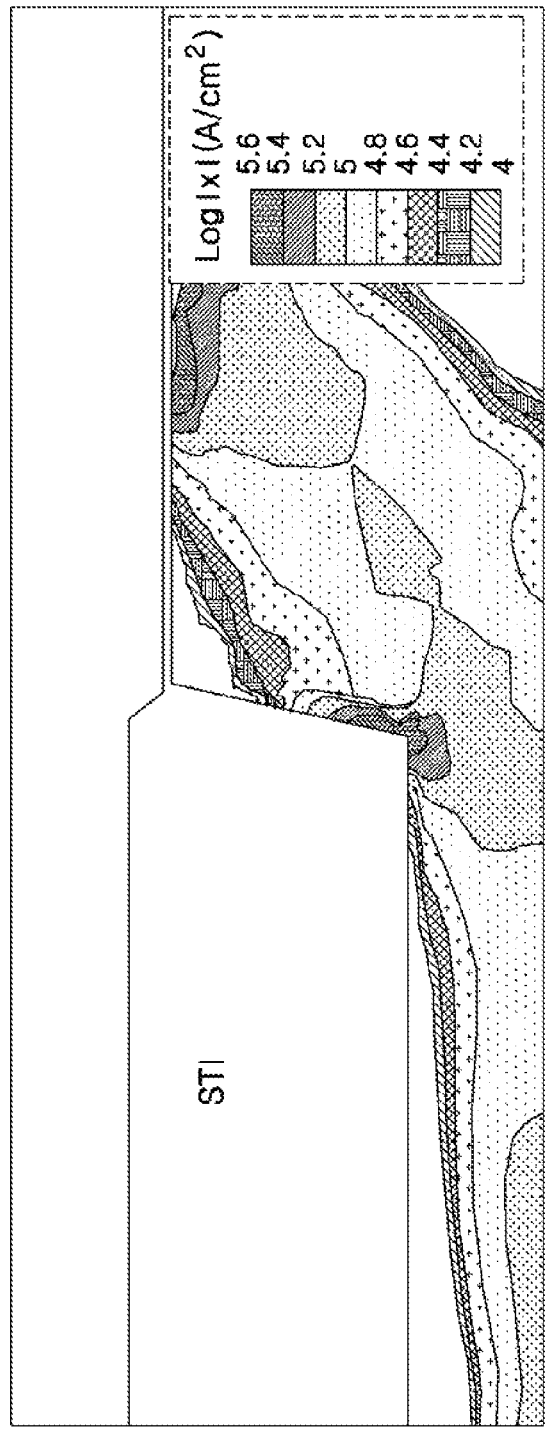
FIG. 1 shows a current flow that is typically observed around an STI layer in a conventional semiconductor device.
Figure 2A:
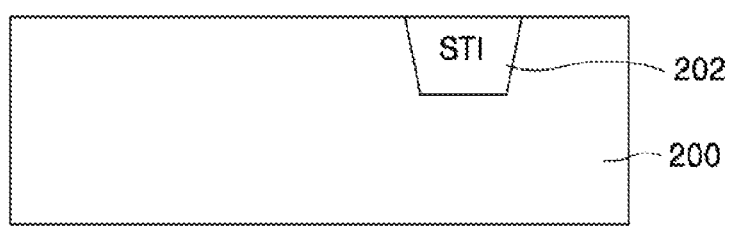
FIGS. 2A to 2G are cross-sectional views illustrating a sequential method for fabricating a semiconductor device in accordance with an embodiment of the present invention.

As illustrated in FIG. 2A, an STI layer 202 is formed in a semiconductor substrate 200. The substrate may be a single-crystal silicon wafer, or a single-crystal silicon wafer with one or more layers of epitaxial silicon grown thereon. The STI layer may be formed by etching a shallow trench in the substrate, and subsequently filling the trench with a dielectric material. Typically, STI trenches have a depth of 0.15-0.5 μm. The STI layer 202 may be formed to have a smaller size than a typical STI layer. For example, STI layer 202 may have a depth in a range of about 50 to about 300 nm (e.g., about 50 nm to about 150 nm, about 50 nm to about 100 nm, about 100 nm to about 200 nm, or any value or range of values therein).

An example of the method of forming the STI layer 202 will now be described. An oxide layer (e.g., silicon oxide formed by thermal oxidation of silicon or chemical vapor deposition [CVD] of TEOS, CVD using silane and dioxygen ($O_2$) and/or ozone ($O_3$) as an oxygen source; not shown) and a nitride layer (e.g., silicon nitride formed by physical vapor deposition [PVD; e.g., sputtering] or CVD; not shown) may be formed on the semiconductor substrate 200 and then etched to form an STI pattern (not shown) that defines STI layer 202. Using the STI pattern as a mask, the semiconductor substrate 200 is etched to form a shallow trench (not shown). An STI oxide layer is subsequently deposited in the shallow trench, to form the STI layer 202. The STI oxide layer may be deposited by CVD (e.g., low pressure CVD [LPCVD], high-density plasma CVD [HDP-CVD], etc.) of TEOS. A liner oxide layer (not shown) may be formed (e.g., by thermal oxidation) in the shallow trench prior to the deposition of the STI oxide layer. The oxide layer and the nitride layer may be removed from the substrate after the STI layer 202 is formed. For example, the nitride layer and oxide layer may be removed by wet or dry etching.

Figure 2B:
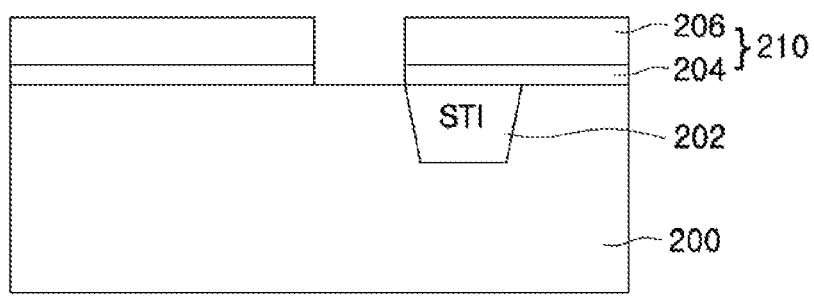

As illustrated in FIG. 2B, a pattern 210 to define a field oxide layer is subsequently formed on the semiconductor substrate 200 so as to expose a portion of the semiconductor substrate 200 adjacent to the STI layer 202. For example, an oxide layer 204 (e.g., silicon oxide formed by thermal oxidation of silicon, CVD of TEOS, or CVD using silane and dioxygen ($O_2$) and/or ozone ($O_3$) as an oxygen source) and a nitride layer 206 (e.g., silicon nitride formed by PVD or CVD) are sequentially formed. Subsequently, a photolithography process is performed to form a photoresist pattern (not shown) exposing a portion of the nitride layer 206 adjacent to the STI layer 202. Thereafter, the nitride layer 206 and the oxide layer 204 are etched using the photoresist pattern as a mask, thereby forming the pattern 210 to define the field oxide layer, and exposing a portion of the semiconductor substrate 200 adjacent to the STI layer 202. The photoresist pattern may then be removed by ashing or stripping.

Figure 2C:
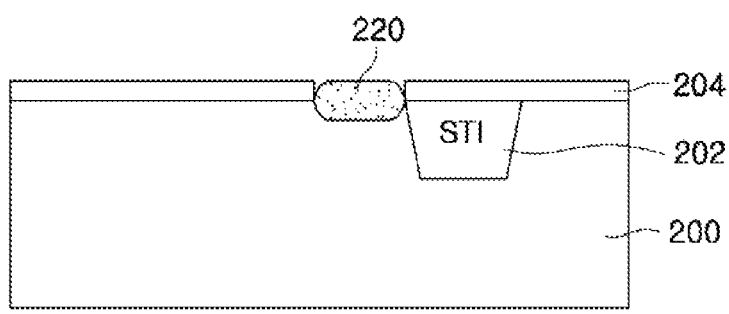

Thereafter, as shown in FIG. 2C, a wet oxidation process is performed using the pattern 210 as a mask, to thereby form a field oxide layer 220 adjacent to the STI layer 202 in the area of the semiconductor substrate 200 exposed by the pattern 210. Next, the nitride layer 206 of the pattern 210 may be removed (e.g., by wet etch). The nitride layer 206 is not removed until after the wet oxidation is performed because the nitride layer 206 limits the growth of oxide to the area of the semiconductor substrate 200 exposed by the pattern 210. Thus, the field oxide layer 220 may be formed on the portion of the semiconductor substrate exposed by the pattern 210, and an edge or lower portion of the field oxide layer 220 may be in contact with an upper edge of the STI layer 202.

During the wet oxidation process, the field oxide layer 220 may be shallower than the STI layer 202 in the semiconductor substrate 200. That is, the depth of the field oxide layer 220 in the semiconductor substrate 200 is less than the depth of the STI layer 202 in the semiconductor substrate 200.

Figure 2D:
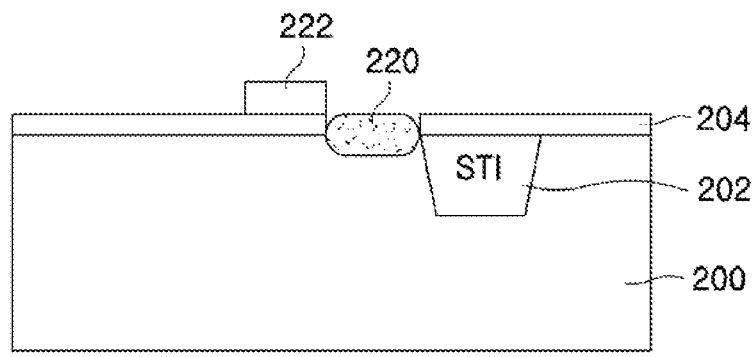

As illustrated in FIG. 2D, a photoresist pattern 222 may be formed over oxide layer 204, covering a portion of the oxide layer 204 adjacent to the field oxide layer 220. The photoresist pattern 222 may be on an opposite side of the field oxide layer 220 from the STI layer 202. The photoresist pattern 222 may be formed by a negative or positive photoresist material and may be patterned by a conventional photolithography process.

Figure 2E:
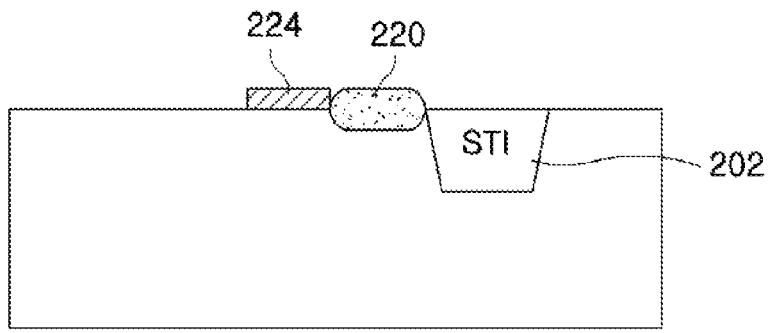

As illustrated in FIG. 2E, the oxide layer 204 may be etched using the photoresist pattern 222 as a mask to form a first gate oxide layer 224 on the semiconductor substrate 200 adjacent to the field oxide layer 220, and may be in contact with an edge of the field oxide layer 220. The first gate oxide layer 224 may be formed on an opposite side of the field oxide layer 220 from the STI layer 202. Subsequently, the photoresist pattern 222 may be removed by ashing, stripping or an etching process.

Figure 2F:
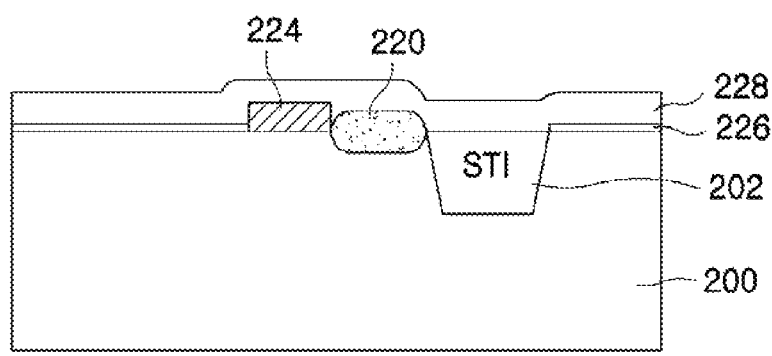

As illustrated in FIG. 2F, a high voltage oxide layer 226 to further enable high voltage operation may be formed on the entire exposed surface of the semiconductor substrate 200 (e.g., areas of the substrate around the first gate oxide layer 224, the field oxide layer 220, the STI layer 202). In one embodiment, the high voltage oxide 226 surrounds the first gate oxide layer 224 on all sides, except where the first gate oxide layer is contact with the field oxide layer 224. Subsequently, a polysilicon layer 228 for forming a gate pattern is deposited over or on the high voltage oxide layer 226. The polysilicon layer 228 may be formed by CVD (e.g., LPCVD).

Figure 2G:
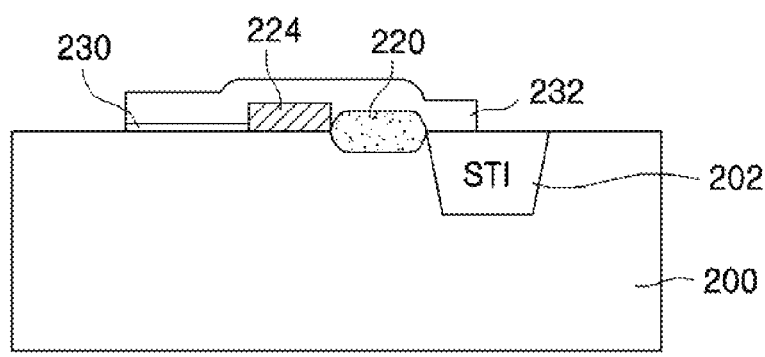

As illustrated in FIG. 2G, the polysilicon layer 228 and the high voltage oxide layer 226 are patterned to form a second gate oxide layer 230 and a gate pattern 232. That is, the gate pattern 232 can cover the second gate oxide layer 230, the first gate oxide layer 224, the adjacent field oxide layer 220, and part of the STI layer 202. The gate pattern 232 may completely cover the first gate oxide layer 224 and the field oxide layer 220. Additionally, the first gate oxide layer 224 may be thicker than the second gate oxide layer 230.

In accordance with embodiments of the present invention, and as shown in FIG. 2G, the semiconductor device may include the field oxide layer 220 in a portion of the semiconductor substrate 200 adjacent to the STI layer 202, and the first gate oxide layer 224 in a portion of the semiconductor substrate 200 adjacent to the field oxide layer 220 (e.g., the first gate oxide layer 224 is in contact with the field oxide layer 220). Consequently, electrons produced in a source area can move through a more mitigated path, and an electric field of the semiconductor device can be kept constant because of the first and second gate oxide layers 224 and 230 below the gate pattern 232.

As described above, the presently disclosed method can form a semiconductor device having improved HCI characteristics by forming a field oxide layer in a portion of the semiconductor substrate adjacent to the STI layer, and then adding a gate oxide layer in a portion of the semiconductor substrate adjacent to the field oxide layer. This arrangement allows electrons produced in a source area to move through a smoother path. Additionally, an electric field of the semiconductor device can be kept constant because of the high voltage gate oxide layer below the gate pattern.

While the description is directed toward embodiments of the present invention, it will be understood by those skilled in the art that various changes, equivalents, and modifications may be made without departing the scope of the present invention as defined in the following claims.

What is claimed is:

1. A method for fabricating a semiconductor device, the method comprising:
    etching a portion of a semiconductor substrate to form a shallow trench isolation (STI) layer;
    sequentially forming an oxide layer and a nitride layer on or over the semiconductor substrate and the STI layer;
    patterning the nitride layer and the oxide layer to expose a portion of the semiconductor substrate adjacent to the STI layer and to define a field oxide region;
    forming a field oxide layer in contact with the STI layer in the exposed portion of the semiconductor substrate;
    removing the nitride layer;
    etching the patterned oxide layer to form a first gate oxide layer in contact with the field oxide layer;
    forming a second gate oxide layer on the semiconductor substrate; and
    forming a gate pattern on or over the field oxide layer, the first gate oxide layer, and the second gate oxide layer.

2. The method of claim 1, wherein the first gate oxide layer is thicker than the second gate oxide layer.

3. The method of claim 1, wherein the first gate oxide layer is in contact with an end portion of the field oxide.

4. The method of claim 1, wherein forming the first gate oxide layer comprises:
    forming a photoresist pattern covering a portion of the patterned oxide layer in contact with the field oxide layer;
    forming the first gate oxide layer by removing areas of the oxide layer exposed by the photoresist pattern; and
    removing the photoresist pattern.

5. The method of claim 1, wherein the field oxide layer has an edge portion that is in contact with an upper edge of the STI layer.

6. The method of claim 1, wherein the gate pattern covers an entire width of the field oxide layer, the entire first gate oxide layer, and the entire second gate oxide layer.

7. The method of claim 1, wherein the gate pattern is on or over a portion of the STI layer.

8. The method of claim 1, wherein the STI layer has a depth less than 150 nm.

9. A method for fabricating a semiconductor device, comprising:
    forming a shallow trench isolation (STI) layer in a substrate;
    sequentially forming an oxide layer and a nitride layer on or over the substrate and the STI layer;
    forming a field oxide layer adjacent to the STI layer in the semiconductor substrate;
    removing the nitride layer;
    etching the oxide layer to forming a first gate oxide layer in contact with the field oxide layer;
    forming a second gate oxide layer on the semiconductor substrate adjacent to the first gate oxide layer, the second gate oxide layer having a thickness less than a thickness of the first gate oxide layer; and
    forming a gate pattern over the field oxide layer, the first gate oxide layer, the second gate oxide layer, and part of the STI layer.

10. The method of claim 9, wherein the first gate oxide layer is in contact with an end portion of the field oxide.

11. The method of claim 9, wherein an edge portion of the field oxide layer is in contact with an the STI layer.

12. The method of claim 9, wherein the gate pattern covers an entire width of the field oxide layer, the entire first gate oxide layer, and the entire second gate oxide layer.

13. The method of claim 9, wherein the STI layer has a depth less than 150 nm.

14. The method of claim 9, wherein forming the field oxide layer comprises:
    patterning the nitride layer and the oxide layer to expose a portion of the substrate adjacent to the STI layer to define a field oxide region; and
    oxidizing the exposed portion of the substrate.

15. The method of claim 1, wherein removing the nitride layer comprises wet etching the nitride layer.

16. The method of claim 1, wherein patterning the nitride layer comprises forming a photoresist pattern by a photolithography process that exposes a portion of the nitride layer adjacent to the STI layer.

17. The method of claim 16, wherein patterning the nitride layer and the oxide layer comprises etching the nitride layer and the oxide layer using the photoresist pattern as a mask.

18. The method of claim 9, wherein removing the nitride layer comprises wet etching the nitride layer.

19. The method of claim 14, wherein patterning the nitride layer comprises forming a photoresist pattern by a photolithography process that exposes a portion of the nitride layer adjacent to the STI layer.

20. The method of claim 19, wherein patterning the nitride layer and the oxide layer comprises etching the nitride layer and the oxide layer using the photoresist pattern as a mask.

* * * * *